(12) United States Patent
Lin

(10) Patent No.: US 10,398,173 B2
(45) Date of Patent: Sep. 3, 2019

(54) DUAL-VOLTAGE ELECTRONIC CIGARETTE CONTROL ASSEMBLY

(71) Applicant: Guangrong Lin, Guangdong (CN)

(72) Inventor: Guangrong Lin, Guangdong (CN)

(*) Notice: Subject to any disclaimer, the term of this patent is extended or adjusted under 35 U.S.C. 154(b) by 441 days.

(21) Appl. No.: 15/308,845

(22) PCT Filed: Mar. 20, 2015

(86) PCT No.: PCT/CN2015/074714
§ 371 (c)(1),
(2) Date: Nov. 4, 2016

(87) PCT Pub. No.: WO2015/169127
PCT Pub. Date: Nov. 12, 2015

(65) Prior Publication Data
US 2017/0071257 A1   Mar. 16, 2017

(30) Foreign Application Priority Data

May 7, 2014 (CN) .................... 2014 2 0231613 U

(51) Int. Cl.
*A61M 15/06* (2006.01)
*A24F 47/00* (2006.01)
(Continued)

(52) U.S. Cl.
CPC ............ *A24F 47/008* (2013.01); *A24F 47/00* (2013.01); *G08B 21/185* (2013.01); *H01H 13/04* (2013.01);
(Continued)

(58) Field of Classification Search
None
See application file for complete search history.

(56) References Cited

U.S. PATENT DOCUMENTS

2011/0097060 A1* 4/2011 Michael Buzzetti ........................ A61M 11/042
392/395
2012/0325227 A1* 12/2012 Robinson .............. A61M 15/06
131/328

(Continued)

FOREIGN PATENT DOCUMENTS

CN    202890466 U    4/2013
CN    202890467 U    4/2013
(Continued)

OTHER PUBLICATIONS

International Search Report of PCT Patent Application No. PCT/CN2015/074714 dated Jun. 18, 2015.

*Primary Examiner* — Thor S Campbell

(57) ABSTRACT

A dual-voltage electronic cigarette control assembly, comprising a casing (4) of the control assembly, a control circuit board (2), and a key switch (3), wherein the control circuit board (2) is fixed into the casing by a fixing unit, and the key switch is electrically connected to the control circuit board. The control circuit board (2) is provided with a power managing module configured for outputting a high preset voltage or a low preset voltage and the power managing module comprises a boost (step-up) unit, a buck (step-down) unit or a buck-boost unit. The dual-voltage electronic cigarette control assembly of the present invention can help users to enjoy different vapor amounts according to their personal preference and enhances the power efficiency.

16 Claims, 3 Drawing Sheets

(51) Int. Cl.
*G08B 21/18* (2006.01)
*H01H 13/04* (2006.01)
*H02J 7/00* (2006.01)
*H03K 17/96* (2006.01)
*H05B 1/02* (2006.01)

(52) U.S. Cl.
CPC ............ *H02J 7/0072* (2013.01); *H03K 17/96* (2013.01); *H05B 1/0244* (2013.01)

(56) References Cited

U.S. PATENT DOCUMENTS

| | | | | |
|---|---|---|---|---|
| 2013/0042865 | A1* | 2/2013 | Monsees | A61M 15/06 128/203.27 |
| 2015/0053217 | A1* | 2/2015 | Steingraber | A24F 47/008 131/329 |
| 2015/0128967 | A1* | 5/2015 | Robinson | A24F 47/008 131/328 |
| 2016/0262459 | A1* | 9/2016 | Monsees | A61M 11/042 |
| 2016/0338412 | A1* | 11/2016 | Monsees | A24F 47/008 |
| 2016/0374397 | A1* | 12/2016 | Jordan | A24F 47/008 131/329 |

FOREIGN PATENT DOCUMENTS

| | | |
|---|---|---|
| CN | 202949974 U | 5/2013 |
| CN | 203070141 U | 7/2013 |

\* cited by examiner

DUAL-VOLTAGE ELECTRONIC CIGARETTE CONTROL ASSEMBLY

FIELD OF THE INVENTION

The present invention relates to electronic cigarette control technology, in particular, to a dual-voltage electronic cigarette control assembly.

BACKGROUND OF THE INVENTION

Electronic cigarettes, also known as virtual cigarettes, are mainly used to help people to quit smoking or replace traditional cigarettes. The electronic cigarette mimics the appearance and flavor of the traditional cigarette and gives the psychological feeling of inhaling the traditional cigarette smoke. Moreover, it even can provide much more flavors than the traditional cigarette. Unlike the traditional cigarette, the amount of vapor produced by the electronic cigarette depends on the heating power of a heating coil. The heating power of the electronic cigarette in prior art is constant, which can simplify the circuit but fails to adjust the amount of vapor. In some existing electronic cigarettes, a potentiometer is often employed for adjusting the heating power, but the adjustment carried out by the potentiometer would lead to extra consuming of electricity, and the output would change along with the voltage of batteries, adversely affecting user experience.

SUMMARY OF THE INVENTION

The present invention aims to provide a dual-voltage electronic cigarette control assembly capable of outputting two stable voltages.

The present invention provides a dual-voltage electronic cigarette control assembly, comprising a casing of the control assembly, a control circuit board, and a key switch, wherein the control circuit board is fixed into the casing by a fixing unit, and the key switch is electrically connected to the control circuit board. The dual-voltage electronic cigarette control assembly is characterized in that the control circuit board is provided with a power managing module, which is configured for alternatively outputting a high preset voltage or a low preset voltage and comprises a boost (step-up) unit, a buck (step-down) unit or a buck-boost unit.

Preferably, the key switch in the dual-voltage electronic cigarette control assembly according to the present invention comprises one or two key/keys and one or two switch/switches.

In one embodiment of the dual-voltage electronic cigarette control assembly of the present invention, the key switch comprises a one-key switch, two different stable voltages can be alternatively outputted depending on the times of the key being pressed;

In another embodiment of the dual-voltage electronic cigarette control assembly of the present invention, the key switch comprises a dual-key switch, two different stable voltages can be alternatively outputted depending on which key is pressed;

In still another embodiment of the dual-voltage electronic cigarette control assembly of the present invention, the key switch comprises a touch key and two switches, two different stable voltages can be alternatively outputted depending on which portion of the key is touched;

In yet another embodiment of the dual-voltage electronic cigarette control assembly of the present invention, the key switch comprises a single touch key, two different stable voltages can be alternatively outputted depending on the times of the key being touched.

Preferably, the power managing module of the dual-voltage electronic cigarette control assembly according to the present invention comprises: a main chip electrically connected to the key switch, and a power managing chip, wherein the main chip is configured for outputting a corresponding pulse width modulation (PWM) signal according to the key switch selection signal and the battery cell voltage signal, and the power managing chip is configured for outputting the high preset voltage or the low preset voltage to a heating coil according to the pulse width modulation (PWM) signal.

Preferably, the dual-voltage electronic cigarette control assembly according to the present invention further comprises a voltage detection unit electrically connected to the main chip and the heating coil, and configured for detecting the voltage of the heating coil, wherein the voltage detection unit is composed of two resistors in series, and the shared intermediate end of them provides feedback to the main chip.

Preferably, the dual-voltage electronic cigarette control assembly according to the present invention further comprises an output switch, which is electrically connected to the main chip and configured for controlling the power managing module to output voltage or not; wherein the on/off signal HOT from the main chip drives the field effect transistor (FET) Q5, Q6, via the triode Q4, to output voltage or not.

Preferably, the dual-voltage electronic cigarette control assembly according to the present invention further comprises a second indicator light configured for indicating a short circuit fault of the heating coil by emitting light out of the casing; when a short circuit fault of the heating coil is detected, the main chip outputs a signal to switch off the output voltage.

Preferably, the key switch in the dual-voltage electronic cigarette control assembly according to the present invention comprises a one-key switch and can switch between the high preset voltage and the low preset voltage by being pressed.

Preferably, the key switch in the dual-voltage electronic cigarette control assembly according to the present invention is configured as follows: the key switch comprises one key and two switches, or two keys and two switches, each of switches corresponds to the high preset voltage or the low preset voltage respectively, and when both of the switches are pressed at the same time, the output voltage is switched off.

Preferably, the key switch in the dual-voltage electronic cigarette control assembly according to the present invention further comprises a charging switch electrically connected to the main chip; when the electronic cigarette is connected to the charging power, the main chip determines whether charging is necessary according to a detected signal and outputs a charging signal to turn the field effect transistors Q2,Q3 on or off, thereby connecting or disconnecting the end BT+ of the battery cell in the electronic cigarette to the charging power.

Preferably, the key switch in the dual-voltage electronic cigarette control assembly according to the present invention is a press switch, a touch switch, or an inductive switch.

Preferably, the key switch in the dual-voltage electronic cigarette control assembly according to the present invention further comprises a first indicator light and a third indicator light respectively configured for indicating the high voltage output and low voltage output by emitting different light out of the casing.

The advantages of the dual-voltage electronic cigarette control assembly of the present invention are as follows. Firstly, two stable voltages can be outputted from the control assembly to the heating coil by controlling the key switch to actuate the boost (step-up) unit or the buck (step-down) unit. Whereby the power efficiency is enhanced and user experience is improved, because the users can freely select either vapor amount according to their personal preference.

Secondly, simple control is realized and the life time of the key switch is lengthened by employing two keys to select high voltage output, low voltage output or no voltage output.

Thirdly, by providing circuit protection, the electronic cigarette is prevented from working continuously when a short circuit fault of the heating coil occurs, and the electronic cigarette is prevented from being actuated and entering smoking mode when the two keys are pressed at the same time.

Figure 1:
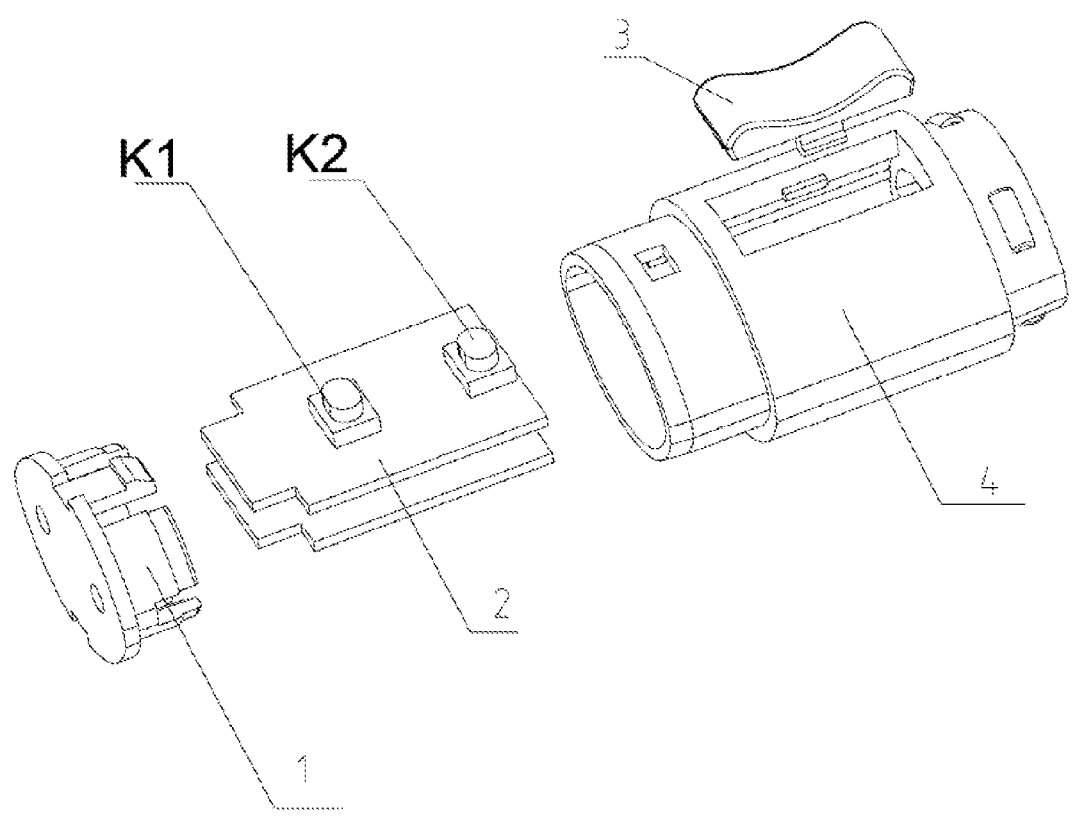
FIG. 1 is an exploded view of a dual-voltage electronic cigarette control assembly according to the present invention.

LIST OF REFERENCE NUMERALS OF MAIN COMPONENTS 1 fixing unit
2 control circuit board
3 key
4 casing

DETAILED DESCRIPTION OF PREFERRED EMBODIMENTS

The present invention will be further explained in detail below with reference to the accompanying drawings.

As shown FIG. 1, a dual-voltage electronic cigarette control assembly comprises a control circuit board 2, a fixing unit 1 for fixing the control circuit board 2 and a casing 4 of the control assembly; two light touch switches K1, K2 are configured on the control circuit board 2, and the casing 4 of the control assembly is configured with a key 3 for matching the light touch switches K1, K2. The key 3 and the light touch switches K1, K2 constitute a key switch and the light touch switches $K_1$, $K_2$ can be controlled by pressing different parts of the key 3.

A circuit and the operating principle of the circuit in a preferred embodiment of the dual-voltage electronic cigarette control assembly according to the present invention is illustrated hereinafter.

Figure 2:
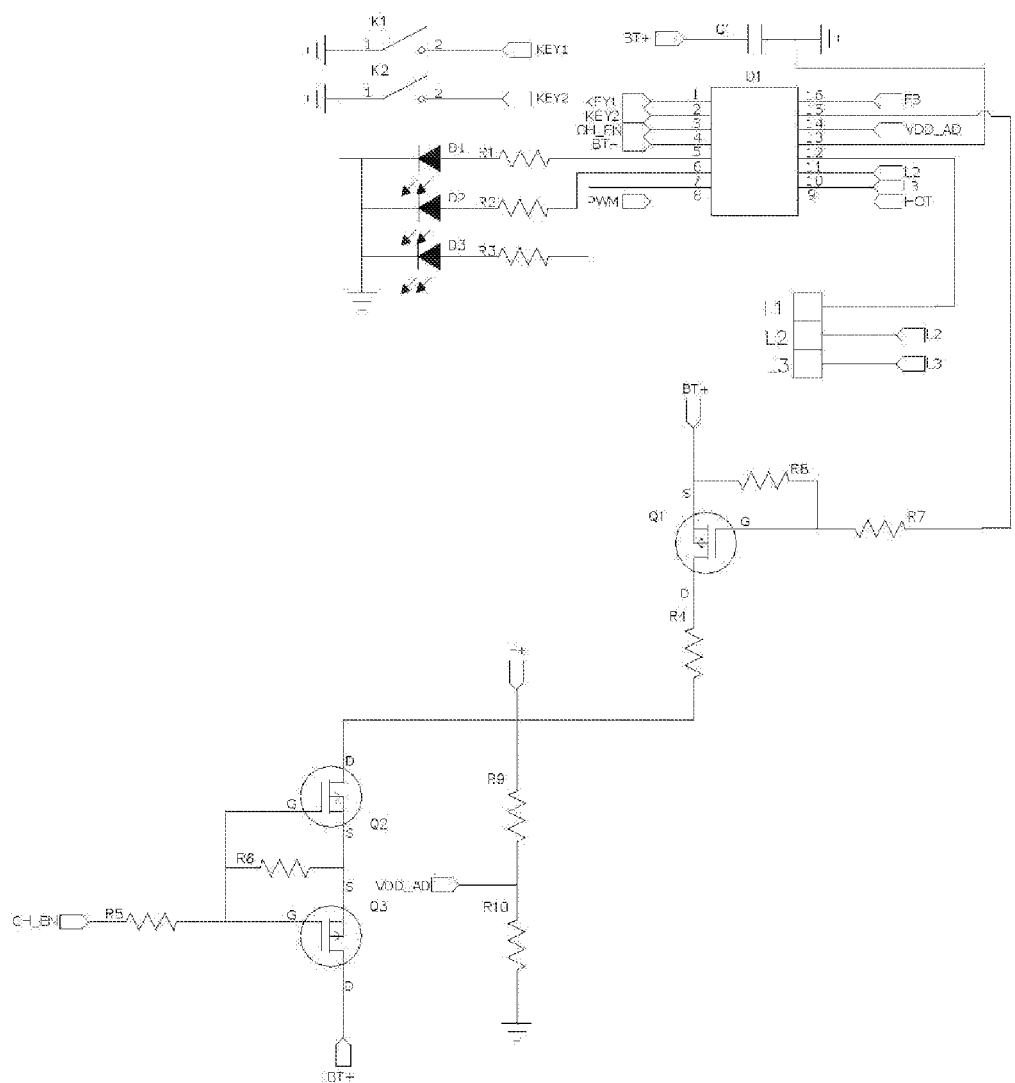
FIG. 2 is a first structural diagram of a circuit of a dual-voltage electronic cigarette control assembly according to the present invention.
Figure 3:
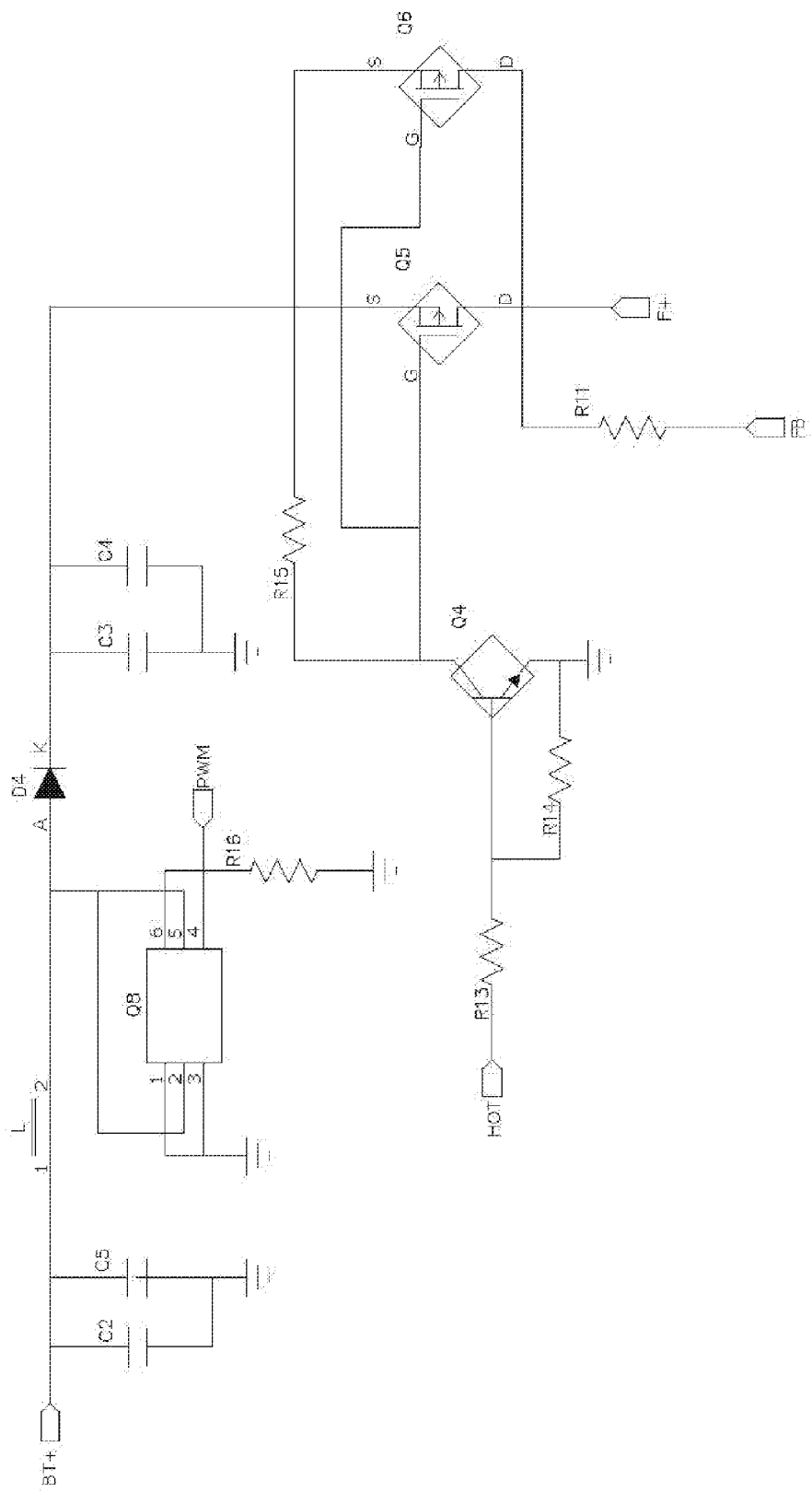
FIG. 3 is a second structural diagram of a circuit of a dual-voltage electronic cigarette control assembly according to the present invention.

Referring to FIGS. 2, 3, the circuit comprises light touch switches K1, K2, indicator lights D1, D2, D3, a main chip U1, a power managing chip Q8, a voltage detection unit composed of R9 and R10, an output switch composed of Q4, Q5 and Q6, and other ancillary circuits, wherein an end BT+ is connected to the battery and an end F+ is connected to a heating coil.

Operating principles of the circuit is as below.

(a) The operating principle of the output of large amount of vapor is as follows.

When the light touch switch K1 is on, a signal $KEY_1$ comes into being, the first indicator light $D_1$ emits white light, at the same time, the main chip $U_1$ outputs a PWM signal with wide duty ratio via its $8^{th}$ pin according to the voltage of a battery cell, the power managing module $Q_8$ outputs corresponding voltage control waveforms via its $2^{nd}$ and $5^{th}$ pins after receiving the PWM signal, the power is converted to a stable output voltage about 4.0V after passing through an inductor L and a freewheeling diode $D_4$, and then the main chip $U_1$ outputs a signal HOT to control a triode $Q_4$ to output a driving signal to turn on two field effect transistors $Q_5$ and $Q_6$, a stable voltage about 4.0 V is inputted to the end F+ to be supplied to the heating coil, at that time, there is a large current passing through the heating coil and a large amount of vapor comes into being.

(b) The operating principle of the output of small amount of vapor is as follows.

When the light touch switch $K_2$ is on, a signal $KEY_2$ comes into being, the third indicator light $D_3$ emits blue light, at the same time, the main chip $U_1$ outputs a PWM signal with narrow duty ratio via its $8^{th}$ pin according to the voltage of the battery cell, the power managing module $Q_8$ outputs corresponding voltage control waveforms via its $2^{nd}$ and $5^{th}$ pins after receiving the PWM signal, the power is converted to a stable output voltage about 3.5V after passing through the inductor L and the freewheeling diode $D_4$, and then the main chip $U_1$ outputs a signal HOT to control the triode $Q_4$ to output a driving signal to turn on the field effect transistors $Q_5$ and $Q_6$, a stable voltage about 3.5 V is inputted to the end F+ to be supplied to the heating coil, at that time, there is a small current passing through the heating coil and a small amount of vapor comes into being.

(c) The operating principle of the short circuit protection is as follows.

During the process of smoking or charging, if a short circuit fault occurs between the end F+ and the ground, a low voltage level is sampled via a pin VDD_AD of the main chip $U_1$, and then the main chip $U_1$ outputs a low voltage level via a pin HOT, the field effect transistors $Q_5$ and $Q_6$ are turned off and nothing is outputted therefrom, meanwhile, the second indicator light $D_2$ flickers with red light to raise an alarm.

(d) The operating principle for cutting of the voltage output is as follows.

If both ends of the key 3 are pressed simultaneously, the light touch switches K1 and K2 are turned on at the same time, the main chip U1 detects that both light touch switches K1 and K2 are grounded at the same time, no PWM signal will be outputted, and the smoking mode is not entered. In this situation, an input command is invalid; meanwhile, an off signal for controlling the triode Q4 to output a driving signal to turn off the field effect transistors Q5 and Q6 is outputted by the main chip U1 via a pin HOT.

(e) The operating principle for charging the battery cell of the electronic cigarette is as follows.

When the battery cell needs charging, the end F+ is connected to a charger, the main chip U1 detects a high voltage level via the pin VDD_AD, a signal is outputted via a pin CH_EN to turn on field effect transistors $Q_2$ and $Q_3$ and the electronic cigarette enters the charging mode. When the battery cell is fully charged, the main chip U1 detects a low voltage level via the pin VDD_AD, a signal is outputted via the pin CH_EN to turn the field effect transistors $Q_2$ and $Q_3$ off and the electronic cigarette exits the charging mode.

All the above are merely the preferred embodiments of the present invention. The present invention is intended to cover various modifications and equivalent arrangements included within the principle and scope of the present invention.

What is claimed is:

1. A dual-voltage electronic cigarette control assembly, comprising a casing (4) of the control assembly, a control circuit board (2), and a key switch, wherein the control circuit board is fixed into the casing (4) by a fixing unit (1), and the key switch is electrically connected to the control circuit board, characterized in that the control circuit board is provided with a power managing module configured for outputting a high preset voltage or a low preset voltage alternatively and the power managing module comprises a boost unit, a buck unit or a buck-boost unit;

the power managing module comprises a main chip ($U_1$) electrically connected to the key switch, and a power managing chip ($Q_8$); wherein the main chip ($U_1$) is configured for outputting a corresponding pulse width modulation (PWM) signal according to a key switch selection signal and a battery cell voltage signal, and the power managing chip ($Q_8$) is configured for outputting the high preset voltage or the low preset voltage to a heating coil connected to an end F+ according to the pulse width modulation (PWM) signal;

the assembly further comprises a voltage detection unit composed of $R_9$ and $R_{10}$ electrically connected to the main chip ($U_1$) and the heating coil connected to the end F+, and configured for detecting the voltage of the heating coil connected to the end F+.

2. The dual-voltage electronic cigarette control assembly according to claim 1, characterized in that the assembly further comprises an output switch composed of Q4, Q5 and Q6 electrically connected to the main chip ($U_1$) and configured for controlling the power managing module to output voltage or not.

3. The dual-voltage electronic cigarette control assembly according to claim 2, characterized in that a second indicator light ($D_2$) configured for indicating a short circuit fault of the heating coil connected to the end F+ by emitting light out of the casing (4).

4. The dual-voltage electronic cigarette control assembly according to claim 2, characterized in that the key switch comprises a one-key switch and can switch between the high preset voltage and the low preset voltage by being pressed.

5. The dual-voltage electronic cigarette control assembly according to claim 2, characterized in that the key switch comprises two light touch switches, each of the light touch switches corresponds to the high preset voltage or the low preset voltage respectively, and when both of the light touch switches are pressed at the same time, the output voltage is switched off.

6. The dual-voltage electronic cigarette control assembly according to claim 2, characterized in that the assembly further comprises a charging switch composed of Q2 and Q3 electrically connected to the main chip ($U_1$).

7. The dual-voltage electronic cigarette control assembly according to claim 2, characterized in that: the assembly further comprises a first indicator light ($D_1$) and a third indicator light ($D_3$) respectively configured for indicating the high voltage output and low voltage output by emitting light of different colors out of the casing (4).

8. The dual-voltage electronic cigarette control assembly according to claim 1, characterized in that the key switch is a press switch, a touch switch, or an inductive switch.

9. The dual-voltage electronic cigarette control assembly according to claim 2, characterized in that the key switch is a press switch, a touch switch, or an inductive switch.

10. The dual-voltage electronic cigarette control assembly according to claim 3, characterized in that the key switch is a press switch, a touch switch, or an inductive switch.

11. The dual-voltage electronic cigarette control assembly according to claim 4, characterized in that the key switch is a press switch, a touch switch, or an inductive switch.

12. The dual-voltage electronic cigarette control assembly according to claim 5, characterized in that the key switch is a press switch, a touch switch, or an inductive switch.

13. The dual-voltage electronic cigarette control assembly according to claim 6, characterized in that the key switch is a press switch, a touch switch, or an inductive switch.

14. The dual-voltage electronic cigarette control assembly according to claim 7, characterized in that the key switch is a press switch, a touch switch, or an inductive switch.

15. A dual-voltage electronic cigarette control assembly, comprising a casing (4) of the control assembly, a control circuit board (2), and a key switch, wherein the control circuit board is fixed into the casing (4) by a fixing unit (1), and the key switch is electrically connected to the control circuit board, characterized in that the control circuit board is provided with a power managing module configured for outputting a high preset voltage or a low preset voltage alternatively and the power managing module comprises a boost unit, a buck unit or a buck-boost unit;

the power managing module comprises a main chip ($U_1$) electrically connected to the key switch, and a power managing chip ($Q_8$); wherein the main chip ($U_1$) is configured for outputting a corresponding pulse width modulation (PWM) signal according to a key switch selection signal and a battery cell voltage signal, and the power managing chip ($Q_8$) is configured for outputting the high preset voltage or the low preset voltage to a heating coil connected to an end F+ according to the pulse width modulation (PWM) signal;

the assembly further comprises an output switch composed of Q4, Q5 and Q6 electrically connected to the main chip ($U_1$) and configured for controlling the power managing module to output voltage or not.

16. The dual-voltage electronic cigarette control assembly according to claim 15, characterized in that the key switch is a press switch, a touch switch, or an inductive switch.

* * * * *